United States Patent
Hasimoto et al.

(10) Patent No.: US 9,791,778 B2
(45) Date of Patent: Oct. 17, 2017

(54) LIQUID PROCESSING METHOD, LIQUID PROCESSING APPARATUS AND RECORDING MEDIUM

(71) Applicant: Tokyo Electron Limited, Tokyo (JP)

(72) Inventors: Takafumi Hasimoto, Koshi (JP); Shinichi Hatakeyama, Koshi (JP); Naoki Shibata, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 55 days.

(21) Appl. No.: 14/963,831

(22) Filed: Dec. 9, 2015

(65) Prior Publication Data

US 2016/0209748 A1  Jul. 21, 2016

(30) Foreign Application Priority Data

Jan. 15, 2015  (JP) .................. 2015-006032

(51) Int. Cl.
*G03B 27/32* (2006.01)
*G03F 7/16* (2006.01)

(52) U.S. Cl.
CPC ..................... *G03F 7/16* (2013.01)

(58) Field of Classification Search
CPC ....... G03F 7/16; G03F 7/162; H01L 21/67051
USPC ......................................................... 355/27
See application file for complete search history.

(56) References Cited

U.S. PATENT DOCUMENTS

| 6,033,728 A | 3/2000 | Kikuchi et al. |
| 6,113,697 A * | 9/2000 | Kim .................. G03F 7/162 118/321 |
| 2011/0075119 A1* | 3/2011 | Ito ..................... G03F 7/2043 355/30 |

FOREIGN PATENT DOCUMENTS

| JP | 02-119929 A1 | 5/1990 |
| JP | 06-326014 A1 | 11/1994 |
| JP | 07-078741 A1 | 3/1995 |
| JP | 2759152 B2 | 5/1998 |
| JP | 2000-288450 A1 | 10/2000 |
| JP | 2007-058200 A1 | 3/2007 |

(Continued)

OTHER PUBLICATIONS

Japanese Office Action (Application No. 2015-006032) dated Feb. 9, 2016.

*Primary Examiner* — Peter B Kim
(74) *Attorney, Agent, or Firm* — Burr & Brown, PLLC

(57) ABSTRACT

There are provided a liquid processing method, a liquid processing apparatus and a recording medium for liquid processing which can enhance the uniformity of the coating state of a processing liquid on a substrate. A coating unit includes a rotary holder for rotating a wafer, a nozzle for supplying a processing liquid onto a surface of the wafer, and a controller for controlling the position of the nozzle with respect to the wafer. A liquid processing method includes: starting the supply of the processing liquid to the surface of the wafer at an eccentric position at a distance from the center of rotation of the wafer, and moving the position on the wafer to which the processing liquid is supplied toward the center of rotation of the wafer while rotating the wafer at a first rotational speed; and, after the processing liquid supply position has reached the center of rotation of the wafer, rotating the wafer at a second rotational speed which is higher than the first rotational speed, thereby allowing the processing liquid to spread toward the periphery of the wafer.

18 Claims, 14 Drawing Sheets

(56) References Cited

FOREIGN PATENT DOCUMENTS

| JP | 2008-173594 A1 | 7/2008 |
| JP | 2010-114328 A1 | 5/2010 |

* cited by examiner

LIQUID PROCESSING METHOD, LIQUID PROCESSING APPARATUS AND RECORDING MEDIUM

CROSS-REFERENCE TO RELATED APPLICATION

This application claims the priority benefit of Japanese Patent Application No. 2015-006032, filed on Jan. 15, 2015, the disclosure of which is incorporated herein by reference in its entirety.

FIELD OF THE INVENTION

The present invention relates to a liquid processing method, a liquid processing apparatus and a recording medium.

DESCRIPTION OF RELATED ART

In a semiconductor manufacturing process, a substrate is subjected to various types of liquid processing. In some cases, bubbles are present in a processing liquid to be applied to a substrate in liquid processing. Patent document 1, for example, discloses a liquid processing apparatus in which a processing liquid supply pipe is provided with a bubble removing pipe as a device for removing bubbles from the processing liquid.

PRIOR ART DOCUMENT

Patent Document

Patent document 1: Japanese Patent Laid-Open Publication No. H2-119929

SUMMARY OF THE INVENTION

Problems to be Solved by the Invention

However, if bubbles in a processing liquid are removed by the liquid processing apparatus described in patent document 1, bubbles can sometimes be entrained in the processing liquid when the liquid reaches a substrate. If the bubbles remain on the substrate, then the coating state of the processing liquid on the substrate could become non-uniform.

It is an object of the instant disclosure to provide a liquid processing method, a liquid processing apparatus and a recording medium for liquid processing which can enhance the uniformity of the coating state of a processing liquid on a substrate.

Means for Solving the Problems

A liquid processing method according to the instant disclosure comprises: starting the supply of a processing liquid to a surface of a substrate at an eccentric position at a distance from the center of rotation of the substrate, and moving the position on the substrate to which the processing liquid is supplied toward the center of rotation of the substrate while rotating the substrate at a first rotational speed; and, after the processing liquid supply position has reached the center of rotation of the substrate, rotating the substrate at a second rotational speed which is higher than the first rotational speed, thereby allowing the processing liquid to spread toward the periphery of the substrate.

Entrainment of bubbles into a processing liquid is likely to occur when the processing liquid reaches a substrate. According to the instant liquid processing method, the supply of the processing liquid to the surface of the substrate is started at an eccentric position at a distance from the center of rotation of the substrate. Therefore, entrainment of bubbles into the processing liquid at the start of supply of the processing liquid is likely to occur at the eccentric position. When the processing liquid spreads on the substrate rotating at the second rotational speed, the centrifugal force generated at the eccentric position is larger than the centrifugal force generated in the vicinity of the center of rotation of the substrate. Further, the distance from the eccentric position to the periphery of the substrate is shorter than the distance from the center of rotation of the substrate to the periphery of the substrate. Accordingly, bubbles entrained in the processing liquid at the start of supply of the processing liquid more easily reach the periphery of the substrate, and thus are less likely to remain on the surface of the substrate.

After the start of supply of the processing liquid, the processing liquid supply position moves toward the center of rotation of the substrate while the substrate is rotating, and therefore the processing liquid is coated in a spiral manner onto the surface of the substrate. Further, the first rotational speed of the substrate, at which the substrate is rotated until the processing liquid supply position reaches the center of rotation of the substrate, is lower than the second rotational speed at which the substrate is rotated when the processing liquid is allowed to spread on the substrate. Therefore, when the processing liquid is coated in a spiral manner onto the substrate, the processing liquid is prevented from spreading toward the periphery of the processing liquid is formed before spreading the processing liquid by rotating the substrate at the second rotational speed. This facilitates spreading of the processing liquid over the entire surface of the substrate during rotation of the substrate at the second rotational speed. As described above, according to the instant liquid processing method, bubbles are less likely to remain on the substrate and, in addition, the processing liquid is more likely to spread over the entire surface of the substrate. This makes it possible to enhance the uniformity of the coating state of the processing liquid on the substrate.

The liquid processing method may further comprise coating a liquid, which promotes spreading of the processing liquid to the periphery of the substrate, onto an area of the surface of the substrate which lies outside the position at which the supply of the processing liquid is started. The processing liquid more easily spreads on the surface of the substrate in the area coated with the liquid which promotes spreading of the processing liquid. Therefore, bubbles will more easily reach the periphery of the substrate. Thus, bubbles can be further prevented from remaining on the substrate.

The supply of the processing liquid to the surface of the substrate may be started at a position whose distance to the center of rotation of the substrate is more than 0% and not more than 40% of the radius of the substrate. As described above, by starting the supply of the processing liquid to the substrate at an eccentric position at a distance from the center of rotation of the substrate, bubbles entrained in the processing liquid at the start of supply of the processing liquid more easily reach the periphery of the substrate. On the other hand, if the eccentric position is too far from the center of rotation of the substrate, it takes a long time to form a puddle of the processing liquid when the substrate is rotating at the first rotational speed, process. By setting the eccentric position at which the supply of the processing liquid is started to be more than 0% and not more than 40% of the radius of the substrate, bubbles can be prevented from remaining on the substrate while maintaining the processing time within an acceptable range.

The amount of the processing liquid supplied to the surface of the substrate per unit time may be made smaller when the substrate is rotating at the first rotational speed than that when the substrate is rotating at the second rotational speed. This can reduce the entrainment of bubbles into the processing liquid during the formation of the puddle, thereby further preventing bubbles from remaining on the substrate.

The amount of the processing liquid supplied to the surface of the substrate per unit time may be made smaller when starting the supply of the processing liquid than that when the processing liquid supply position is moving toward the center of rotation of the substrate. This can reduce the entrainment of bubbles into the processing liquid at the start of supply of the processing liquid, thereby further preventing bubbles from remaining on the substrate.

The substrate may be rotated at least one revolution after starting the supply of the processing liquid and before moving the processing liquid supply position toward the center of rotation of the substrate. In this case, the processing liquid is first coated in an annular shape on the surface of the substrate, and then coated in a spiral manner onto the area of the surface which lies inside the annular coating. This can make the shape of the puddle of the processing liquid more circular, and thus can prevent the puddle from becoming non-uniform in the circumferential direction. Therefore, when rotating the substrate at the second rotational speed, the processing liquid is more likely to spread uniformly over the entire surface of the substrate.

The moving speed of the processing liquid supply position may be increased as it approaches the center of rotation of the substrate. This enhances the uniformity of the thickness of the puddle. Therefore, the processing liquid more easily spreads on the substrate when the substrate is rotated at the second rotational speed.

The rotational speed of the substrate may be increased as the processing liquid supply position approaches the center of rotation of the substrate. This enhances the uniformity of the thickness of the puddle. Therefore, the processing liquid more easily spreads on the substrate when the substrate is rotated at the second rotational speed.

The distance between an outlet opening for ejecting the processing liquid toward the substrate and the surface of the substrate may be made shorter when the substrate is rotating at the second rotational speed than that when the substrate is rotating at the first rotational speed. When the rotational speed of the substrate is increased from the first rotational speed to the second rotational speed, a liquid column extending from the outlet opening to the substrate can sometimes tilt due to the high-speed rotation of the substrate, resulting in non-uniform coating of the processing liquid on the surface of the substrate. The liquid column is less likely to tilt by making the distance between the outlet opening and the surface of the substrate shorter when the substrate is rotating at the second rotational speed. This can enhance the uniformity of the coating state of the processing liquid on the substrate.

A liquid processing apparatus according to the instant disclosure comprises: a rotary holder configured to hold and to rotate a substrate; a nozzle disposed above the substrate; a nozzle moving section configured to move the nozzle; a processing liquid supply section configured to supply a processing liquid to the nozzle; and a controller configured to control the rotary holder to rotate the substrate at a first rotational speed, to control the nozzle moving section to move the nozzle to a position above an eccentric position on the substrate which lies at a distance from the center of rotation of the substrate, to control the processing liquid supply section to start the supply of the processing liquid to the surface of the substrate at the eccentric position at a distance from the center of rotation of the substrate, to control the nozzle moving section so that the position on the substrate to which the processing liquid is supplied moves toward the center of rotation of the substrate and, after the processing liquid supply position has reached the center of rotation of the substrate, to control the rotary holder to rotate the substrate at a second rotational speed which is higher than the first rotational speed, thereby allowing the processing liquid to spread on the surface of the substrate.

A recording medium according to the instant disclosure stores a program for causing an apparatus to perform the above-described liquid processing method.

Advantageous Effects of the Invention

According to the instant disclosure, the uniformity of the coating state of a processing liquid on a substrate can be enhanced.

DETAILED DESSCRIPTION OF THE INVENTION

[Substrate Processing System]

Figure 1:
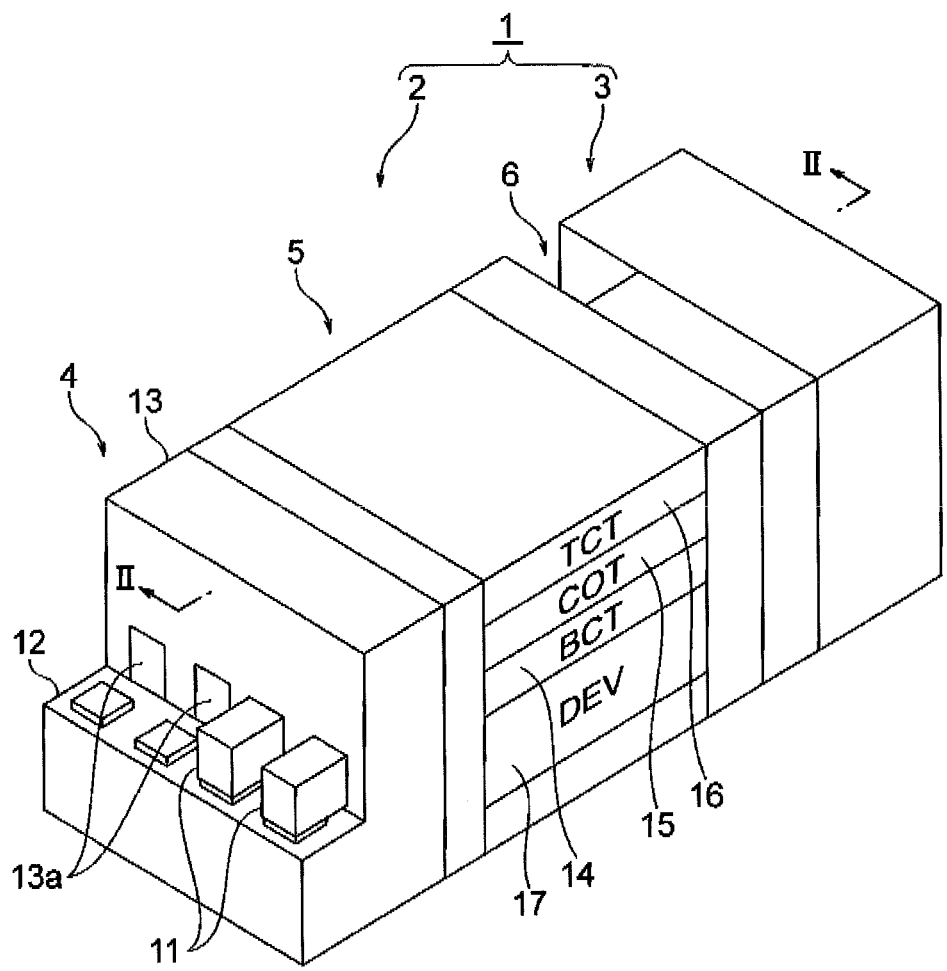
FIG. 1 is a perspective view showing a schematic construction of a substrate processing system according to an embodiment of the present invent.

At the outset, a substrate processing system 1 according to an embodiment of the present invention will be described with reference to FIGS. 1 through 3. As shown in FIG. 1, the substrate processing system 1 includes a coating/developing apparatus 2 and an exposure apparatus 3. The exposure apparatus 3 performs exposure processing of a resist film (photosensitive coating). In particular, an exposure target portion of the resist film is irradiated with energy rays by an exposure method such as liquid immersion exposure.

The coating/developing apparatus 2 performs processing to form a resist film on a surface of a wafer W (substrate) before exposure processing by means of the exposure apparatus 3, and performs development processing of the resist film after the exposure processing.

Figure 2:
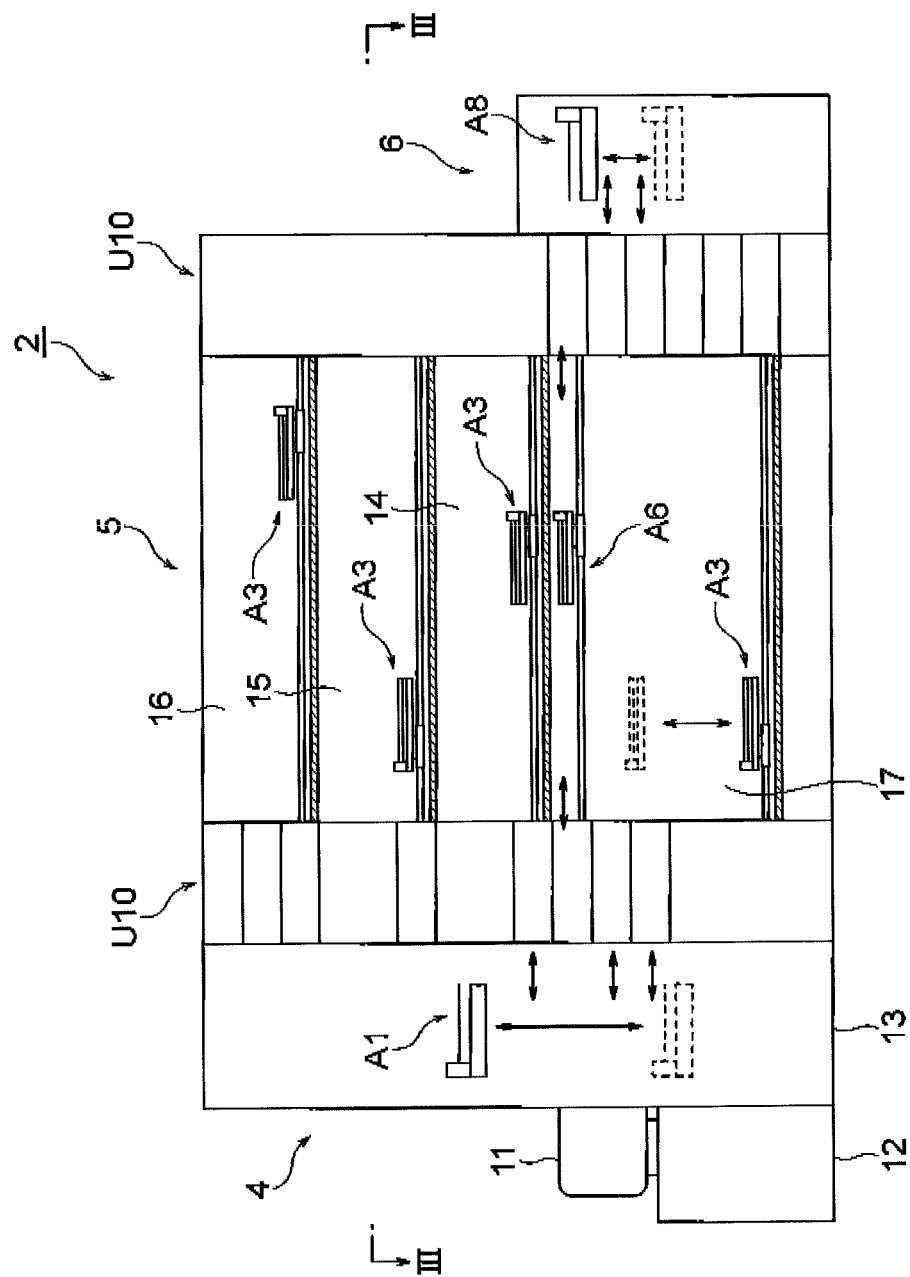
FIG. 2 is a cross-sectional view taken along the line II-II of FIG. 1.
Figure 3:
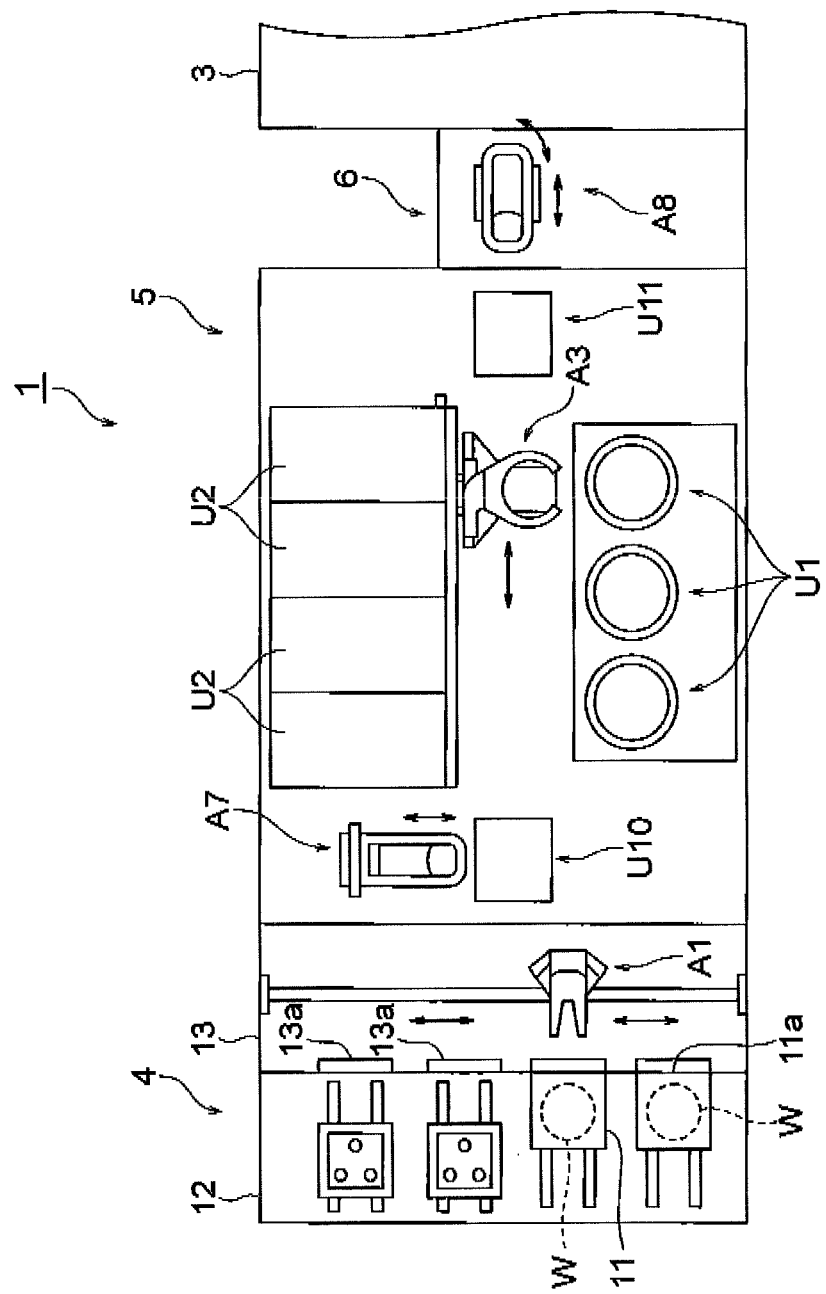
FIG. 3 is a cross-sectional view taken along the line III-III of FIG. 2.

As shown in FIGS. 2 and 3, the coating/developing apparatus 2 includes a carrier block 4, a processing block 5 and an interface block 6. The carrier block 4, the processing block 5 and the interface block 6 are arranged side-by-side in a horizontal direction.

The carrier block 4 includes a carrier station 12 and a carry-in/carry-out section 13. The carry-in/carry-out section 13 is located between the carrier station 12 and the processing block 5. The carrier station 12 supports a plurality of carriers 11. The carriers 11 each house a plurality of substrates, e.g. circular wafers W, in a hermetically-sealed condition. Each carrier 11 has, in one side 11a, an opening/closing door for taking a wafer W in and out. The carriers 11 are detachably installed on the carrier station 12 with the sides 11a facing the carry-in/carry-out section 13.

The carry-in/carry-out section 13 has opening/closing doors 13a corresponding to the carriers 11 on the carrier station 12. By simultaneously opening the opening/closing door in the side 11a of a carrier 11 and the corresponding opening/closing door 13a, the interior of the carrier 11 communicates with the interior of the carry-in/carry-out section 13. The carry-in/carry-out section 13 has, in its interior, a transfer arm A1 (see FIGS. 2 and 3). The transfer arm A1 takes a wafer W out of a carrier 11 and transfers the wafer W to the processing block 5. Further, the transfer arm A1 receives a wafer W from the processing block 5 and returns the wafer W into the carrier 11.

The processing block 5 includes processing modules 14, 15, 16, 17. The processing modules 14, 15, 16, 17 each contain a plurality of coating units U1, a plurality of thermal treatment units U2, and a transport arm A3 for transporting a wafer W to these units (see FIG. 3). The processing module 17 further contains a direct transport arm A6 for transporting a wafer W without via the coating units U1 and the thermal treatment units U2 (see FIG. 2). The coating units U1 each apply a resist solution, or a liquid for processing associated with the formation of a resist film, to the surface of a wafer W.

The processing module 14 is a BCT module for forming a lower film on the surface of a wafer W by means of the coating unit U1 and the thermal treatment unit U2. The coating unit U1 of the processing module 14 applies a liquid for forming a lower film onto a wafer W. The thermal treatment unit U2 of the processing module 14 performs a thermal treatment associated with the formation of the lower film.

The processing module 15 is a COT module for forming a resist film on the lower film by means of the coating unit U1 and the thermal treatment unit U2. The coating unit U1 of the processing module 15 applies a liquid (resist solution) for forming a resist film onto the lower film. The thermal treatment unit U2 of the processing module 15 performs a thermal treatment associated with the formation of the resist film.

The processing module 16 is a TOT module for forming an upper film on the resist film by means of the coating unit U1 and the thermal treatment unit U2. The coating unit U1 of the processing module 16 applies a liquid for forming an upper film onto the resist film. The thermal treatment unit U2 of the processing module 16 performs a thermal treatment associated with the formation of the upper film.

The processing module 17 is a DEV module for performing development processing of a resist film after exposure by means of the coating unit U1 and the thermal treatment unit U2. The developing unit performs development processing of the resist film by applying a developer onto the surface of the wafer W after exposure, and then rinsing off the developer with a rinsing liquid. The thermal treatment unit performs a thermal treatment associated with the development processing. The thermal treatment may be exemplified by a PEB (Post-Exposure Bake) treatment before development and a PB (Post Bake) treatment after development.

In the processing block 5, a shelf unit U10 is provided in a position near the carrier block 4, and a shelf unit U11 is provided in a position near the interface block 6 (see FIGS. 2 and 3). The shelf unit U10 extends from the floor to the processing module 16, and is divided into a number of cells arranged side-by-side in the vertical direction. A lifting arm A7 is provided in the vicinity of the shelf unit U10. The lifting arm A7 vertically moves a wafer W between the cells of the shelf unit U10. The shelf unit U11 extends from the floor to the top of the DEV module 17, and is divided into a number of cells arranged side-by-side in the vertical direction.

The interface block 6 contains a transfer arm A8, and is connected to the exposure apparatus 3. The transfer arm A8 transfers a wafer W in the shelf unit U11 to the exposure apparatus 3, and receives a wafer W from the exposure apparatus 3 and returns the wafer W to the shelf unit U11.

The substrate processing system 1 performs a coating/developing process by the following procedure. First, the transfer arm A1 transports a wafer W in the carrier 11 to the shelf unit U10. The lifting arm A7 places the wafer W in a cell for the processing module 14, and the transport arm A3 transports the wafer W between predetermined units in the processing module 14. The coating unit U1 and the thermal treatment unit U2 of the processing module 14 form a lower film on the surface of the wafer W which has been transported by the transport arm A3. Upon completion of the formation of the lower film, the transport arm A3 returns the wafer W to the shelf unit U10.

Next, the lifting arm A7 places the wafer W, which has been returned to the shelf unit U10, in a cell for the processing module 15, and the transport arm A3 transports the wafer W between predetermined units in the processing module 15. The coating unit U1 and the thermal treatment unit U2 of the processing module 15 form a resist film on the lower film of the wafer W which has been transported by the transport arm A3. Upon completion of the formation of the resist film, the transport arm A3 returns the wafer W to the shelf unit U10.

Next, the lifting arm A7 places the wafer W, which has been returned to the shelf unit U10, in a cell for the processing module 16, and the transport arm A3 transports the wafer W between predetermined units in the processing module 16. The coating unit U1 and the thermal treatment unit U2 of the processing module 16 form an upper film on the resist film of the wafer W which has been transported by the transport arm A3. Upon completion of the formation of the upper film, the transport arm A3 returns the wafer W to the shelf unit U10.

Next, the lifting arm A7 places the wafer W, which has been returned to the shelf unit U10, in a cell for the processing module 17, and the direct transport arm A6 transports the wafer W to the shelf unit U11. The transfer arm A8 transfers the wafer W to the exposure apparatus 3. Upon completion of exposure processing in the exposure apparatus 3, the transfer arm A8 receives the wafer W from the exposure apparatus 3, and returns the wafer W to the shelf unit U11.

Next, the transport arm A3 of the processing module 17 transports the wafer W, which has been returned to the shelf unit U11, between predetermined units in the processing module 17. The coating unit U1 and the thermal treatment unit U2 of the processing module 17 perform development processing of the resist film and associated thermal treatment on the wafer W which has been transported by the transport arm A3. Upon completion of the development of the resist film, the transport arm A3 transports the wafer W to the shelf unit 10.

Next, the lifting arm A7 places the wafer W, which has been transported to the shelf unit U10, in a cell for transfer, and the transfer arm A1 returns the wafer W into the carrier 11, thereby completing the coating/developing process.

[Liquid Processing Apparatus]

Figure 4:
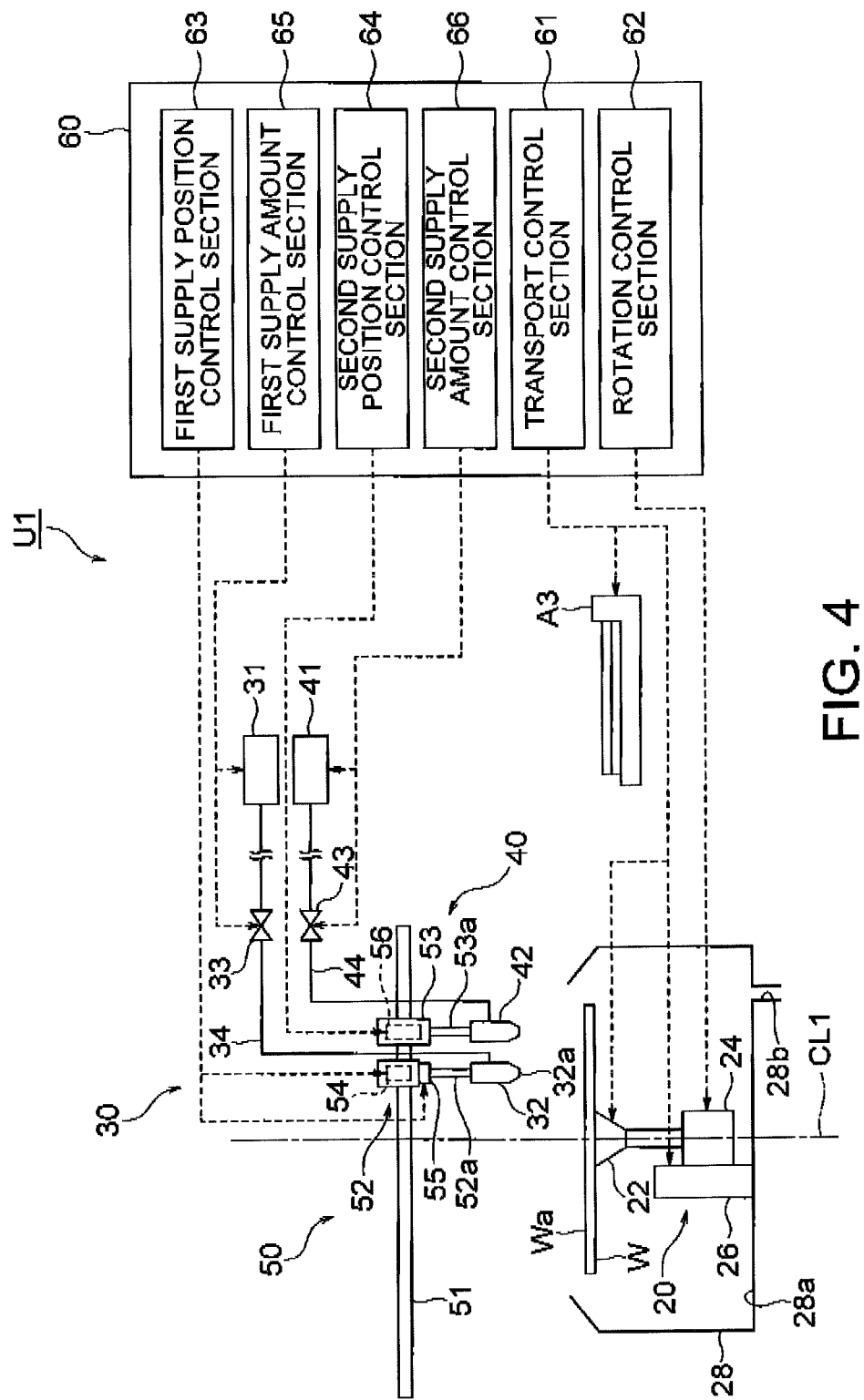
FIG. 4 is a diagram showing a schematic construction of a coating unit.

The construction of the coating unit U1 as an exemplary liquid processing apparatus will now be described in detail. As shown in FIG. 4, the coating unit U1 includes a rotary holder 20, a processing liquid supply section 30, a pre-wetting liquid supply section 40, a nozzle moving section 50, and a controller 60.

The rotary holder 20 includes a holder portion 22, a rotating portion 24 and a lifting portion 26, and holds and rotates a wafer W. The holder portion 22 attracts and holds a central portion of the wafer W, e.g. held in a horizontal position, from below. The rotating portion 29 rotates the holder portion 22 on a vertical axis by means of a power source such as a motor. The lifting portion 26 vertically moves the holder portion 22.

The holder portion 22 is housed in a cup 28. The cup 28 opens upward. The cup 28 recovers a processing liquid that has been forced out of the wafer W. The cup 28 has, in the bottom 28a, a drainage port 28b to which is connected a drainage duct (not shown).

The processing liquid supply section 30 includes a processing liquid supply source 31, a nozzle 32 and a valve 33. The processing liquid supply source 31 is connected via a line 34 to the nozzle 32. The processing liquid supply source 31 feeds a processing liquid to the nozzle 32 by means of a pump (not shown). The processing liquid is, for example, a resist solution for forming a resist film on the surface Wa of the wafer W. The viscosity of the resist liquid is, for example, 20 to 220 cP.

The nozzle 32 is disposed above the holder portion 22. The nozzle 32 has a downwardly-open orifice (outlet opening) 32a, and downwardly ejects the processing liquid supplied from the processing liquid supply source 31. The valve 33 is provided in the line 34. The valve 33 adjusts the degree of opening of the line 34.

When the processing liquid is fed to the nozzle 32 from the processing liquid supply source 31, the processing liquid is ejected downwardly from the nozzle 32 and supplied onto the surface Wa of the wafer W held on the holder portion 22.

The pre-wetting liquid supply section 40 includes a pre-wetting liquid supply source 41, a nozzle 42 and a valve 43. The pre-wetting liquid supply source 41 is connected via a line 44 to the nozzle 42. The pre-wetting liquid supply source 41 feeds a pre-wetting liquid to the nozzle 42 by means of a pump (not shown). The pre-wetting liquid is a liquid which promotes spreading of the processing liquid on a wafer. A liquid whose wetting to the surface Wa of the wafer W is higher than the processing liquid, for example, is preferably used as the pre-wetting liquid. A thinner is an example of such a liquid.

The nozzle 42 is disposed above the holder portion 22. The nozzle 42 opens downwardly, and downwardly ejects the pre-wetting liquid supplied from the pre-wetting liquid supply source 41. The valve 43 is provided in the line 44. The valve 43 adjusts the degree of opening of the line 44.

When the pre-wetting liquid is fed to the nozzle 42 from the pre-wetting liquid supply source 41, the pre-wetting liquid is ejected downwardly from the nozzle 42 and supplied onto the surface Wa of the wafer W held on the holder portion 22.

The nozzle moving section 50 includes a guide rail 51, movable bodies 52, 53 and drives 54 to 56.

The guide rail 51 extends horizontally above and beside the cup 28. The movable body 52 is mounted to the guide rail 51. The movable body 52 has an arm 52a holding the nozzle 32. The movable body 53 is mounted to the guide rail 51. The movable body 53 has an arm 53a holding the nozzle 42.

The drive 54 moves the movable body 52 along the guide rail 51, thereby horizontally moving the nozzle 32. The drive 55 vertically moves the arm 52a, thereby vertically moving the nozzle 32. The drive 56 moves the movable body 53 along the guide rail 51, thereby horizontally moving the nozzle 42. The drives 54 to 56 each use an electric motor or the like as a power source.

The controller 60 includes a transport control section 61, a rotation control section 62, a first supply position control section 63, a second supply position control section 64, a first supply amount control section 65, and a second supply amount control section 66.

The transport control section 61 controls the holder portion 22, the lifting portion 26 and the transport arm A3 to carry a wafer into/out of the coating unit U1. The rotation control section 62 controls the rotating portion 24 to rotate a wafer W. The first supply position control section 63 controls the drive 54 to horizontally move the nozzle 32, and controls the drive 55 to vertically move the nozzle 32. The second supply position control section 64 controls the drive 56 to horizontally move the nozzle 42. The first supply amount control section 65 controls the processing liquid supply source 31 and the valve 33 to adjust the amount of the processing liquid supplied from the nozzle 32. The second supply amount control section 66 controls the pre-wetting liquid supply source 41 and the valve 43 to adjust the amount of the pre-wetting liquid supplied from the nozzle 42.

The controller 60 may be comprised of one or more control computers. The controller 60 includes elements, such as a processor, a memory and a monitor of the control computer(s), which operate in cooperation with each other. The hardware constituting the elements of the controller 60 is not limited to a processor, a memory and a monitor. For example, the controller 60 may include, as an element, an electrical circuit specialized for a particular function, or an ASIC (Application Specific Integrated Circuit) in which such electrical circuits are integrated.

A program for causing the control computer(s) to function as the controller 60 may be recorded on a computer-readable recording medium. Thus, the software for causing the liquid processing apparatus to perform the below-described liquid processing method is recorded on the recording medium.

Examples of the computer-readable recording medium include a hard disk, a compact disk, a flash memory, a flexible disk, a memory card, etc.

[Liquid Processing Method]

A procedure for coating a processing liquid by means of the coating unit U1 will now be described as an exemplary liquid processing method.

Figure 5:
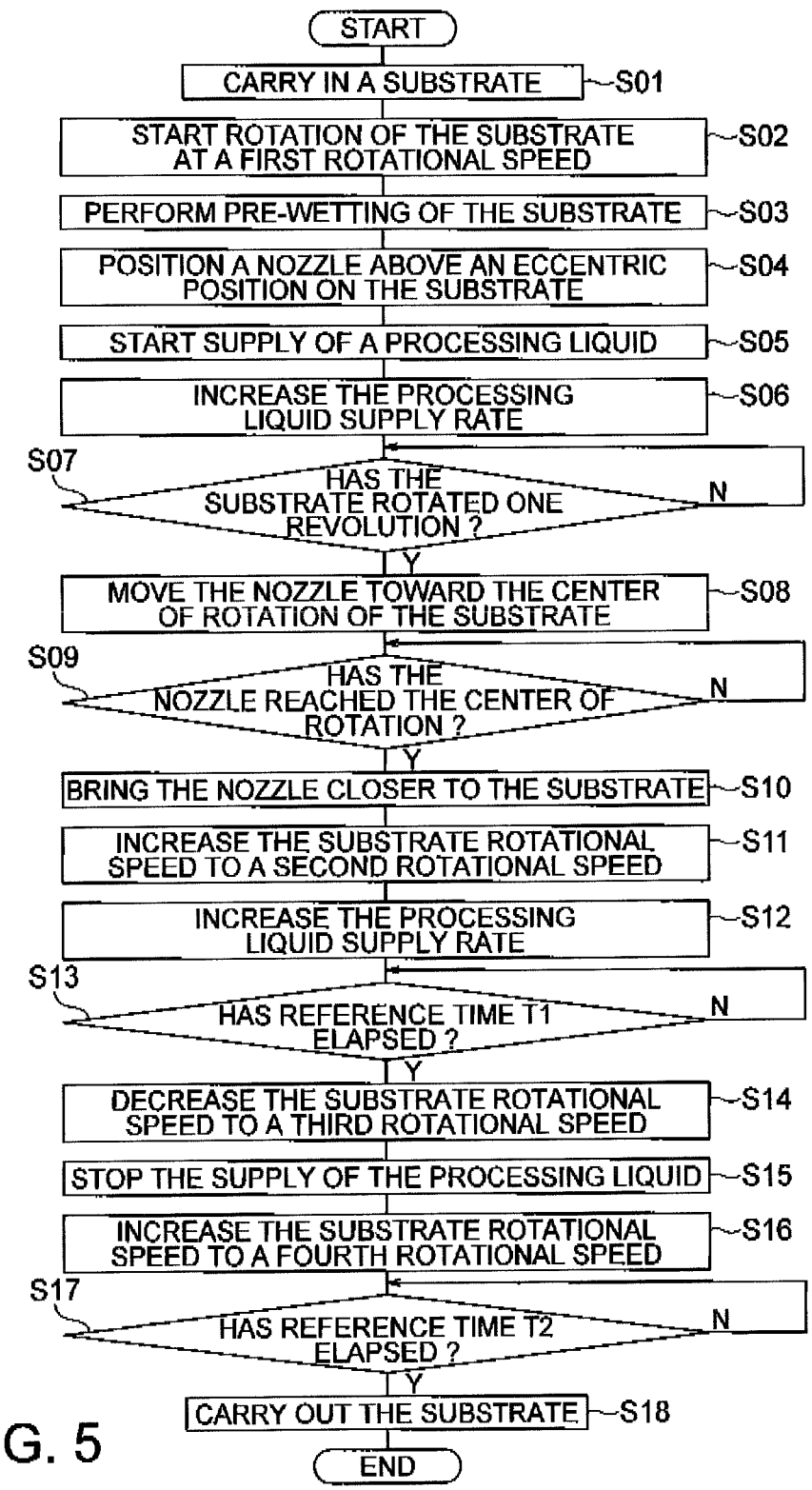
FIG. 5 is a flow chart showing a procedure for performing a liquid processing method.

As shown in FIG. 5, the controller 60 first performs step S01. In step S01, the transport control section 61 controls the holder portion 22, the lifting portion 26 and the transport arm A3 to carry a wafer W into the coating unit U1. In particular, the transport control section 61 controls the lifting portion 26 to raise the holder portion 22 out of the cup 28, controls the transport arm A3 to place a wafer W on the holder portion 22, controls the holder portion 22 to attract the wafer W placed on it, and controls the lifting portion 26 to lower the wafer W into the cup 28.

Next, the controller 60 performs step S02. In step S02, the rotation control section 62 controls the rotating portion 24 to rotate the wafer W to be processed at a first rotational speed $\omega 1$. The first rotational speed $\omega 1$ is, for example, more than 0 rpm and not more than 120 rpm.

Figure 8:
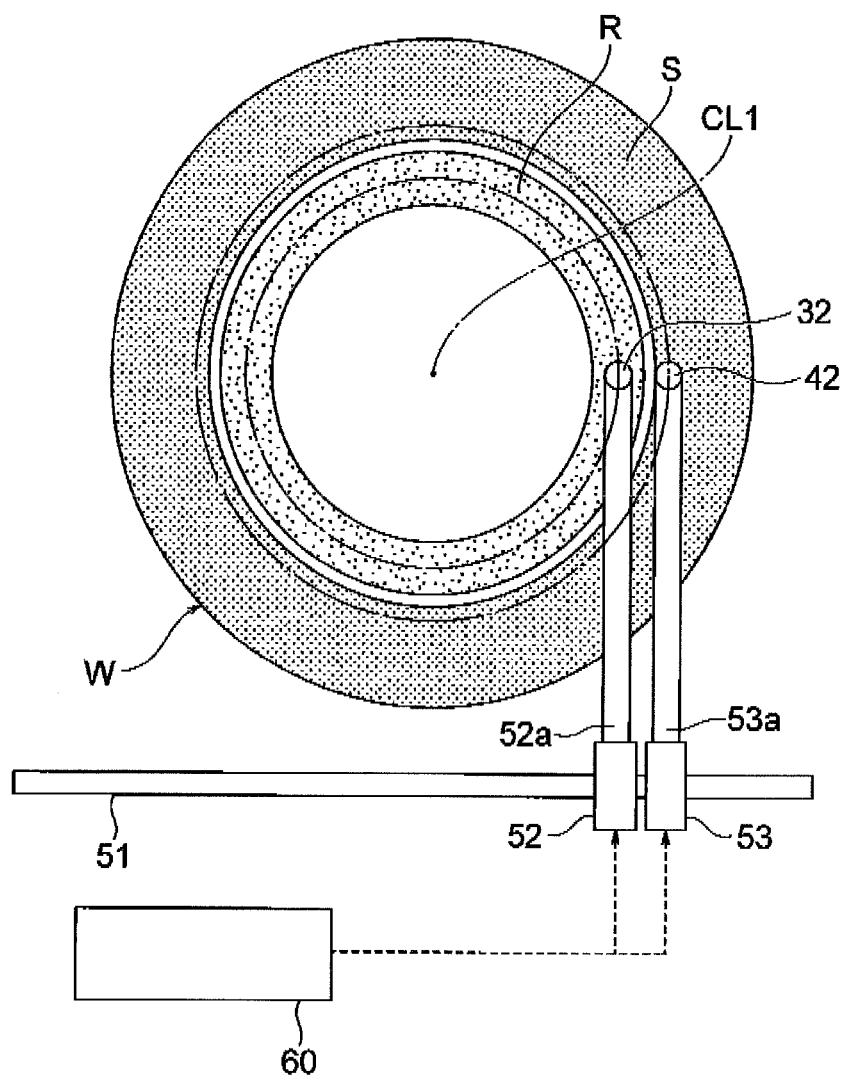
FIG. 8 is a plan view illustrating coating of the processing liquid onto the substrate surface.

Next, the controller 60 performs step S03. In step S03, the second supply position control section 64 controls the drive 56 to move the nozzle 42 to a position above a position on the wafer W which lies nearer to the periphery of the wafer W than the below-described supply start position at which the supply of a processing liquid R is started. Thereafter, the second supply amount control section 66 controls the pre-wetting liquid supply source 41 and the valve 43 so that a pre-wetting liquid S is ejected from the nozzle 42 (FIG. 8A). Consequently, the pre-wetting liquid S is coated on the surface Wa of the wafer W in a peripheral area lying outside the position at which the supply of a processing liquid R is started (see FIG. 8). The amount of the pre-wetting liquid S supplied per unit time is, for example, 25 to 125 ml/sec.

Next, the controller 60 performs step S04. In step S04, the first supply position control section 63 controls the drive 54 to move the nozzle 32 to a position above an eccentric position on the wafer W which lies at a distance from the center CL1 of rotation of the wafer W. For example, the first supply position control section 63 controls the drive 54 to move the nozzle 32 to a position above a position on the wafer W whose distance to the center CL1 of rotation of the wafer W is more than 0% and not more than 40% of the radius of the wafer W.

Figure 6A:
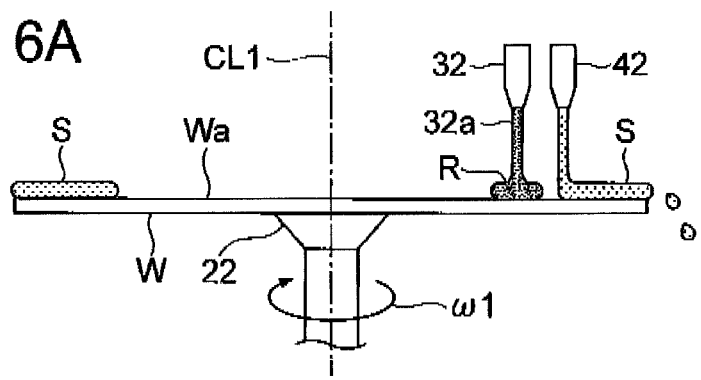
FIGS. 6A through 6D are side views illustrating coating of a processing liquid onto a substrate surface.

Next, the controller 60 performs steps S05 and S06. In step S05, the first supply amount control section 65 controls the processing liquid supply source 31 and the valve 33 so that the processing liquid R is ejected from the nozzle 32. The supply of the processing liquid R to the surface Wa of the wafer W is started at the eccentric position at a distance from the center CL1 of rotation of the wafer W (see FIG. 6A).

Figure 11A:
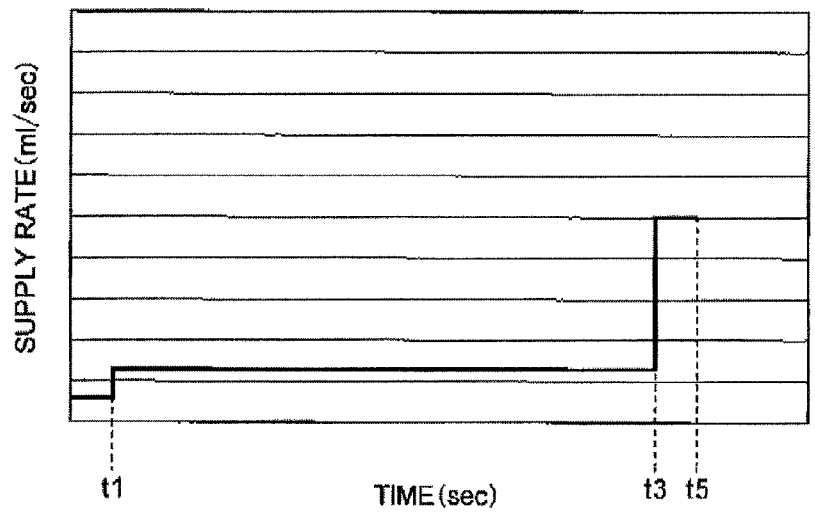
FIGS. 11A and 11B are graphs showing a relationship between the rotational speed of a substrate and the supply rate of a processing liquid.

In step S05, the amount of the processing liquid R supplied from the nozzle 32 to the wafer W per unit time (hereinafter referred to as "supply rate") is set lower than the supply rate required in later processing. Therefore, in step S06, the first supply amount control section 65 controls at least one of the processing liquid supply source 31 and the valve 33 to increase the supply rate of the processing liquid R. FIG. 11A is a graph showing change in the supply rate over time. In the graph, time t1 indicates the time of execution of step S06. It is also possible for the first supply amount control section 65 to gradually increase the supply rate by gradually opening the valve 33. The supply rate may be set arbitrarily e.g. based on the viscosity of the processing liquid R.

Next, the controller 60 performs step S07. In step S07, the controller 60 waits for the wafer W to rotate at least one revolution, whereby the processing liquid R is coated in an annular shape on the surface Wa of the wafer W (see FIG. 8).

Figure 6B:
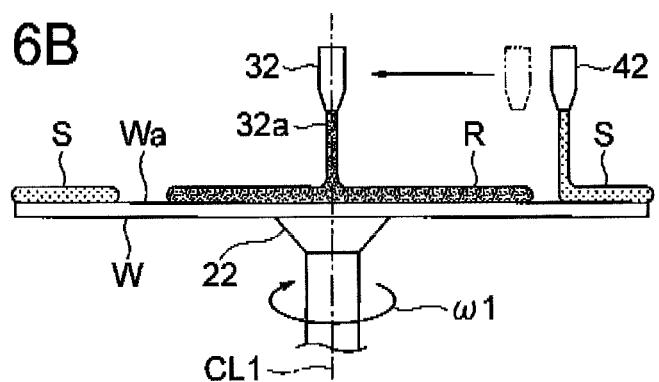
Figure 9:
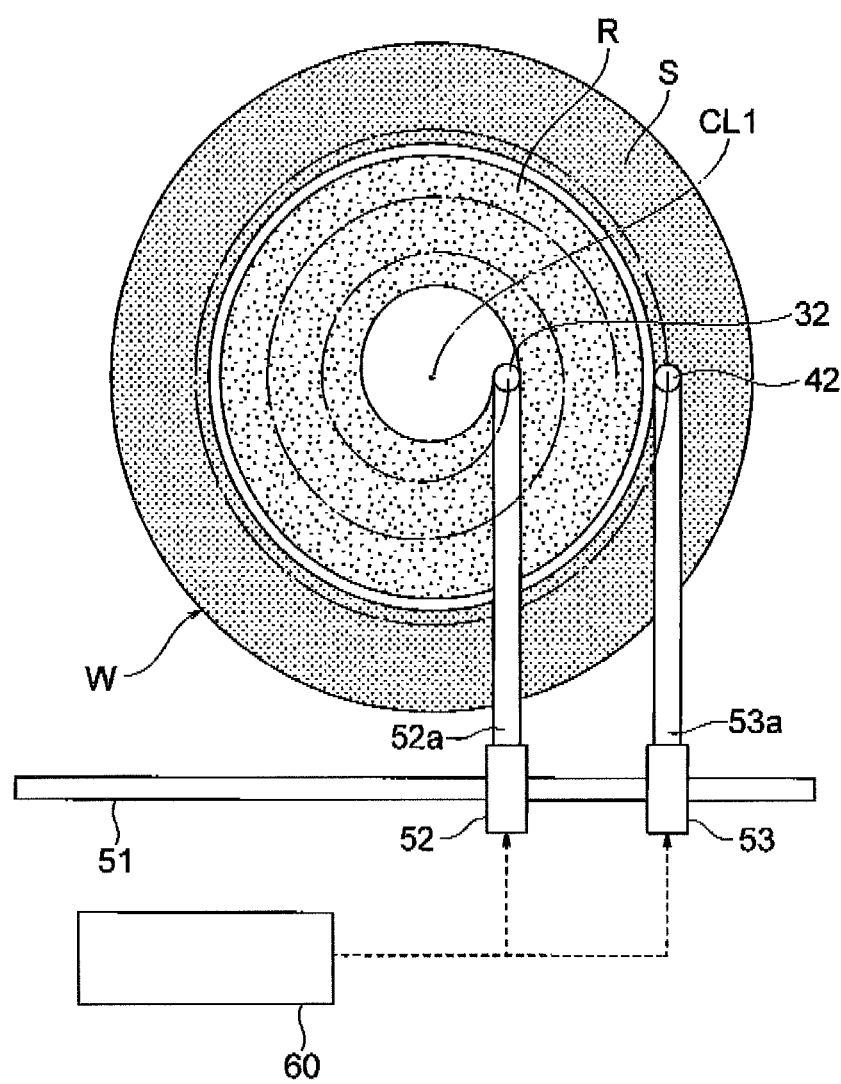
FIG. 9 is a plan view illustrating coating of the processing liquid onto the substrate surface.

Next, the controller 60 performs step S08. In step S08, the first supply position control section 63 controls the drive 54 to move the nozzle 32 toward a position above the center CL1 of rotation of the wafer W (see FIG. 6B). Since the position on the wafer W to which the processing liquid R is supplied moves toward the center CL1 of rotation of the wafer W, the processing liquid R is coated in a spiral manner onto the surface Wa of the wafer W (see FIG. 9). The moving speed of the nozzle 32 when it moves to the position above the center CL1 of rotation of the wafer W is, for example, 4 mm/sec in this embodiment.

In step S08, the rotation control section 62 may control the rotating portion 24 so that the rotational speed of the wafer W increases as the processing liquid supply position approaches the center CL1 of rotation of the wafer W. In particular, the rotation control section 62 may control the rotating portion 24 so that the moving speed (linear speed) of the wafer W just below the nozzle 32 becomes constant. Further, in step SOB, the first supply position control section 63 may control the drive 54 so that the moving speed of the processing liquid supply position increases as it approaches the center CL1 of rotation of the wafer W. The control to increase the rotational speed of the wafer W as the processing liquid supply position approaches the center CL1 of rotation of the wafer W may be performed in combination with the control to increase the moving speed of the processing liquid supply position as it approaches the center CL1 of rotation of the wafer W.

Next, the controller 60 performs step S09. In step S09, the controller 60 waits for the nozzle 32 to reach the center CL1 of rotation of the wafer W.

Figure 6C:
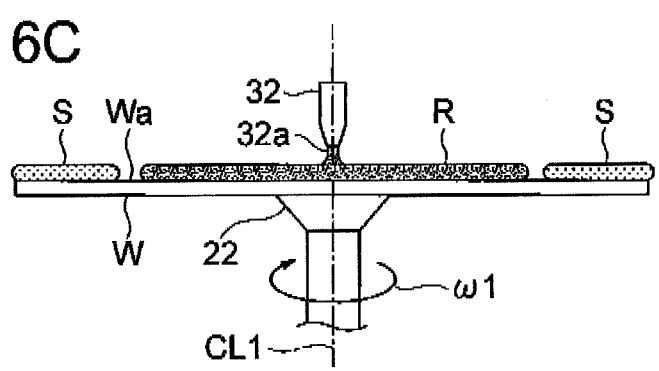
Figure 10:
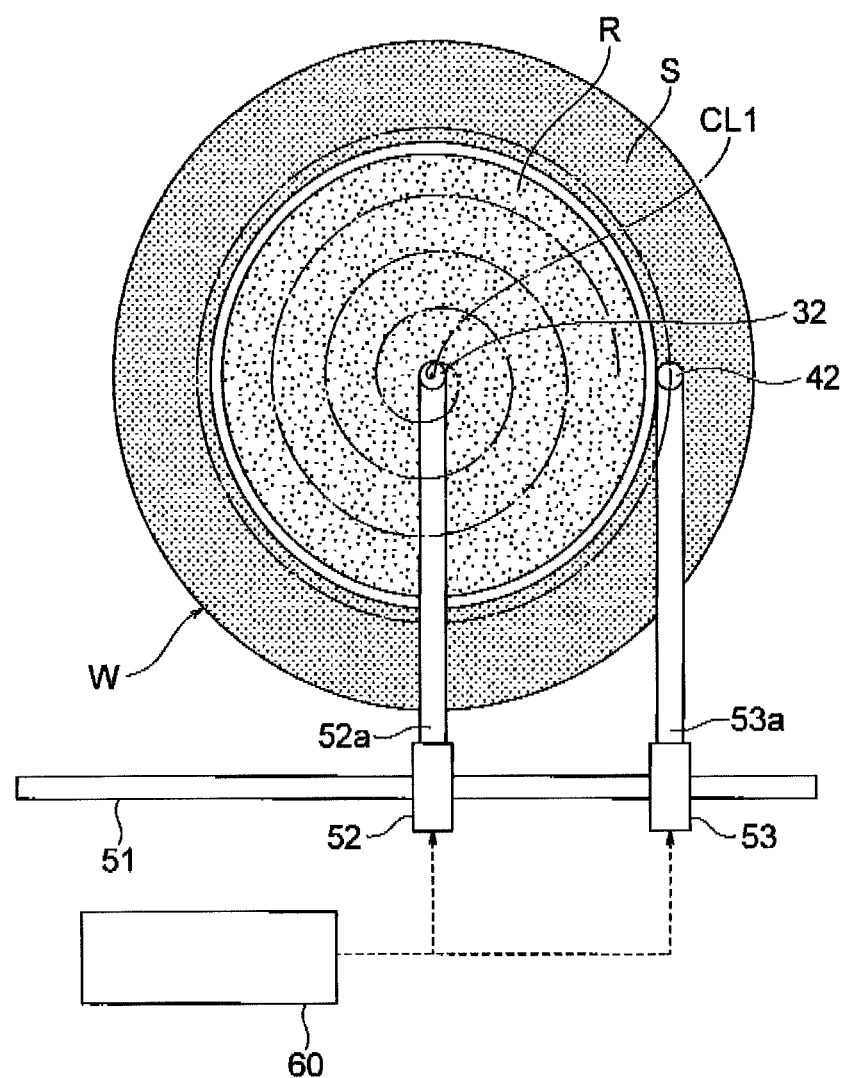
FIG. 10 is a plan view illustrating coating of the processing liquid onto the substrate surface.

Next, the controller 60 performs step S10 (see FIG. 10). In step S10, the first supply position control section 63 controls the drive 55 to shorten the distance between the orifice 32a of the nozzle 32 and the surface Wa of the wafer W (see FIG. 6C). For example, the distance between the orifice 32a and the surface Wa is 4 to 6 mm before execution of step S10, and 2 to 4 mm after execution of step S10.

Figure 6D:
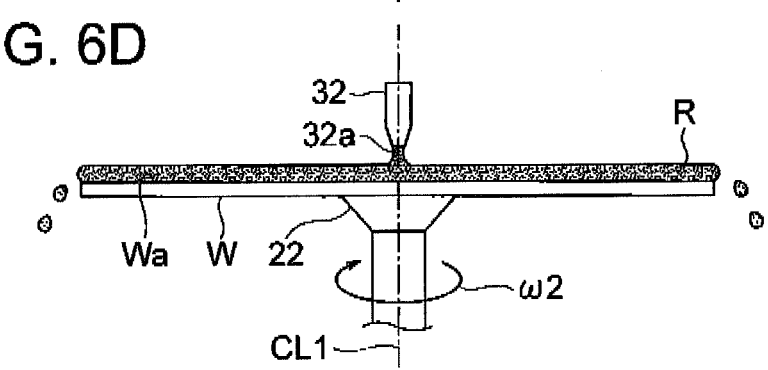
Figure 11B:
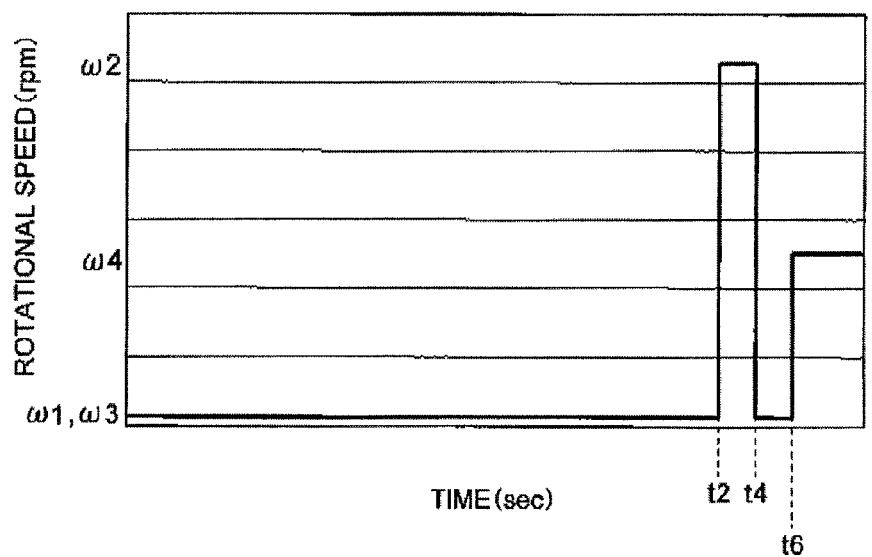

Next, the controller 60 performs step S11. In step S11, the rotation control section 62 controls the rotating portion 24 to change the rotational speed of the wafer W to a second rotational speed $\omega 2$. FIG. 11B is a graph showing change in the rotational speed of the wafer W over time. In the graph, time t2 indicates the time of execution of step S11. As shown in the graph, the second rotational speed $\omega 2$ is higher than the first rotational speed $\omega 1$. Therefore, the processing liquid R spreads to the periphery of the wafer W (see FIG. 6D). The second rotational speed $\omega 2$ is, for example, 1500 to 4000 rpm. As described above, the orifice 32a of the nozzle 32 has come closer to the surface Wa of the wafer W in step S10. Thus, the distance between the orifice 32a and the surface Wa is shorter when the wafer W is rotating at the second rotational speed $\omega 2$ than when the wafer W is rotating at the first rotational speed $\omega 1$.

Next, the controller 60 performs step S12. In step S12, the first supply amount control section 65 controls the processing liquid supply source 31 to increase the supply rate of the processing liquid R. In the graph shown in FIG. 11A, time t3 indicates the time of execution of step S12.

Next, the controller 60 performs step S13. In step S13, the controller 60 waits for a preset reference time T1 to elapse. The reference time T1 is, for example, set such that it allows for the processing liquid R to fully spread on the surface Wa of the wafer W. In this embodiment the reference time T1 is, for example, one second.

Figure 7A:
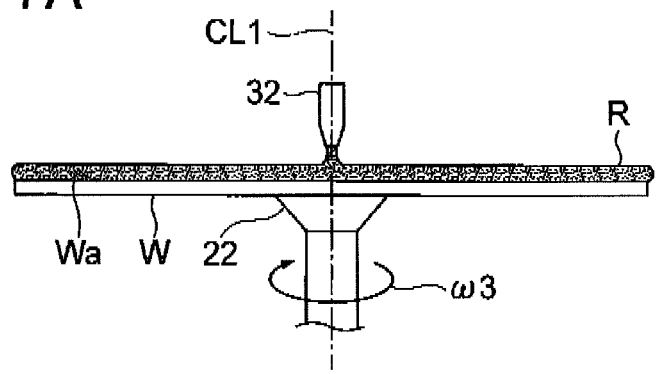
FIGS. 7A through 7C views illustrating ng of the processing liquid onto the substrate surface.

Next, the controller 60 performs steps S14 and S15. In step S14, the rotation control section 62 controls the rotating portion 24 to change the rotational speed of the wafer W to a third rotational speed ω3 (see FIG. 7A). In FIG. 11B, time t4 indicates the time of execution of step S14. As shown in FIG. 11B, the third rotational speed ω3 is lower than the second rotational speed ω2. In one example, the third rotational speed ω3 is set equal to the first rotational speed ω1 in step S11.

Figure 7B:
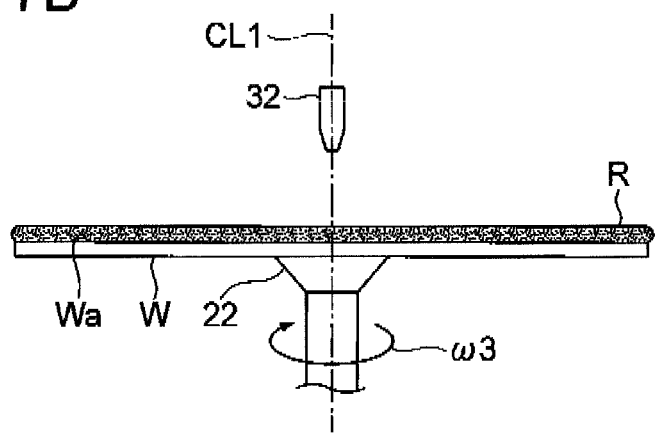

In step S15, the first supply amount control section 65 controls the processing liquid supply source 31 and the valve 33 to stop the supply of the processing liquid R (see FIG. 7B). In FIG. 11A, time t5 indicates the time of execution of step S15.

On or after the execution of step 15, the first supply position control section 63 may control the drive 55 to restore the distance between the orifice 32a of the nozzle 32 and the surface Wa of the wafer W to that before the execution of step 10.

Figure 7C:
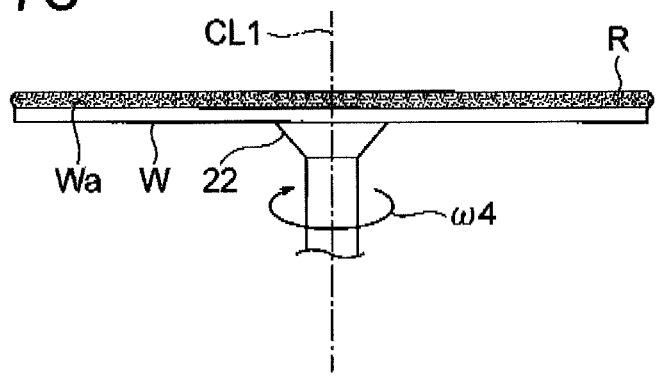

Next, the controller 60 performs step S16. In step S16, the rotation control section 62 controls the rotating portion 24 to rotate the wafer W at a fourth rotational speed ω4 (see FIG. 7C). In FIG. 11B, time t6 indicates the time of execution of step S16. As shown in FIG. 113, the fourth rotational speed ω4 is higher than the third rotational speed ω3 and lower than the second rotational speed ω2.

Next, the controller 60 performs step S17. In step S17, the controller 60 waits for a preset reference time T2 to elapse (see FIG. 7C). The reference time T2 is set such that it allows for the liquid film on the surface Wa of the wafer W to dry. The reference time T2 is, for example, 20 to 60 seconds. A coating film is thus formed on the surface Wa of the wafer W.

Next, the controller 60 performs step S18. In step S18, the transport control section 61 controls the holder portion 22, the lifting portion 26 and the transport arm A3 to carry the wafer W out of the coating unit U1. In particular, the transport control section 61 controls the lifting portion 26 to raise the holder portion 22 out of the cup 28, controls the holder portion 22 to release the attraction of the wafer W, controls the transport arm A3 to receive the wafer W from the holder portion 22 and carry out the wafer W, and controls the lifting portion 26 to lower the holder portion 22 into the cup 28.

While the procedure for coating a processing liquid by means of the coating unit U1 has been described, the order of the above steps may be changed arbitrarily.

As described hereinabove, the liquid processing method according to the instant disclosure comprises: starting the supply of a processing liquid R to the surface Wa of a wafer W at an eccentric position at a distance from the center CL1 of rotation of the wafer W, and moving the position on the wafer W to which the processing liquid R is supplied toward the center CL1 of rotation of the wafer W while rotating the wafer W at a first rotational speed ω1; and, after the processing liquid supply position has reached the center CL1 of rotation of the wafer W, rotating the wafer W at a second rotational speed ω2 which is higher than the first rotational speed ω1, thereby allowing the processing liquid R to spread toward the periphery of the wafer W.

Entrainment of bubbles into the processing liquid R is likely to occur when the processing liquid R reaches the wafer W. According to the liquid processing method of this embodiment, the supply of the processing liquid R to the surface Wa of the wafer W is started at an eccentric position at a distance from the center CL1 of rotation of the wafer W. Therefore, entrainment of bubbles into the processing liquid R at the start of supply of the processing liquid R is likely to occur at the eccentric position. When the processing liquid R spreads on the wafer W rotating at the second rotational speed ω2, the centrifugal force generated at the eccentric position is larger than the centrifugal force generated in the vicinity of the center CL1 of rotation of the wafer W. Further, the distance from the eccentric position to the periphery of the wafer W is shorter than the distance from the center CL1 of rotation of the wafer W to the periphery of the wafer W. Accordingly, bubbles entrained in the processing liquid R at the start of supply of the processing liquid R more easily reach the periphery of the wafer W, and thus are less likely to remain on the surface Wa of the wafer W.

After the start of supply of the processing liquid R, the processing liquid supply position moves toward the center CL1 of rotation of the wafer W while the wafer W is rotating, and therefore the processing liquid R is coated in a spiral manner onto the surface Wa of the wafer W. The first rotational speed ω1 of the wafer W, at which the wafer W is rotated until the processing liquid supply position reaches the center CL1 of rotation of the wafer W, is lower than the second rotational speed ω2 at which the wafer W is rotated when the processing liquid R is allowed to spread on the wafer W. Therefore, when the processing liquid R is coated in a spiral manner onto the wafer W, the processing liquid R is prevented from spreading toward the periphery of the wafer W. Accordingly, a generally circular puddle of the processing liquid R is formed before spreading the processing liquid R by rotating the wafer W at the second rotational speed ω2. This facilitates spreading of the processing liquid R over the entire surface Wa of the wafer W during rotation of the wafer W at the second rotational speed ω2. As described above, according to the liquid processing method of this embodiment, bubbles are less likely to remain on the wafer W and, in addition, the processing liquid R is more likely to spread over the entire surface Wa of the wafer W. This makes it possible to enhance the uniformity of the coating state of the processing liquid R on the wafer W.

The liquid processing method may further comprise coating a liquid, which promotes spreading of the processing liquid R to the periphery of the wafer W, onto an area of the surface Wa of the wafer W which lies outside the position at which the supply of the processing liquid R is started. The processing liquid R more easily spreads on the surface Wa of the wafer W in the area coated with the liquid which promotes spreading of the processing liquid R. Therefore, bubbles will more easily reach the periphery of the wafer W. Thus, bubbles can be further prevented from remaining on the wafer W.

The supply of the processing liquid R onto the surface Wa of the wafer W may be started at a position whose distance to the center CL1 of rotation of the wafer W is more than 0% and not more than 40% of the radius of the wafer W. As described above, by starting the supply of the processing liquid R to the wafer W at an eccentric position at a distance from the center CL1 of rotation of the wafer W, bubbles entrained in the processing liquid R at the start of supply of the processing liquid R more easily reach the periphery of the wafer W. On the other hand, if the eccentric position is too far from the center CL1 of rotation of the wafer W, it takes a long time to form a puddle of the processing liquid R when the wafer W is rotating at the first rotational speed ω1, and therefore it takes a long time to complete the coating process. By setting the eccentric position at which the supply of the processing liquid R is started to be more than 0% and not more than 40% of the radius of the wafer W, bubbles can be prevented from remaining on the wafer W while maintaining the processing time within an acceptable range.

The amount of the processing liquid R supplied to the surface Wa of the wafer W per unit time may be made smaller when the wafer W is rotating at the first rotational speed ω1 than when the wafer W is rotating at the second rotational speed ω2. This can reduce the entrainment of bubbles into the processing liquid R during the formation of the puddle, thereby further preventing bubbles from remaining on the wafer W.

The amount of the processing liquid R supplied to the surface Wa of the wafer W per unit time may be made smaller when starting the supply of the processing liquid R than when the processing liquid supply position is moving toward the center CL1 of rotation of the wafer W. This can reduce the entrainment of bubbles into the processing liquid R at the start of supply of the processing liquid R, thereby further preventing bubbles from remaining on the wafer W.

In the above-described embodiment, the first supply amount control section 65 may control the rate of opening of the valve 33 so as to gradually increase the supply rate of the processing liquid R. The gentle change in the processing liquid supply rate can further reduce the entrainment of bubbles into the processing liquid R at the start of supply of the processing liquid R. This can further prevent bubbles from remaining on the wafer W.

The wafer W may be rotated at least one revolution after starting the supply of the processing liquid R and before moving the processing liquid supply position toward the center CL1 of rotation of the wafer W. In this case, the processing liquid R is first coated in an annular shape on the surface We of the wafer W, and then coated in a spiral manner onto the area of the surface Wa which lies inside the annular coating. This can make the shape of the puddle of the processing liquid R more circular, and thus can prevent the puddle from becoming non-uniform in the circumferential direction. Therefore, when rotating the wafer W at the second rotational speed ω2, the processing liquid R is more likely to spread uniformly over the entire surface Wa of the wafer W.

The moving speed of the processing liquid supply position may be increased as it approaches the center CL1 of rotation of the wafer W. This enhances the uniformity of the thickness of the puddle. Therefore, the processing liquid R more easily spreads on the wafer W when the wafer W is rotated at the second rotational speed ω2.

The rotational speed of the wafer W may be increased as the processing liquid supply position approaches the center CL1 of rotation of the wafer W. This enhances the uniformity of the thickness of the puddle. Therefore, the processing liquid R more easily spreads on the wafer W when the wafer W is rotated at the second rotational speed ω2.

Figure 12A:
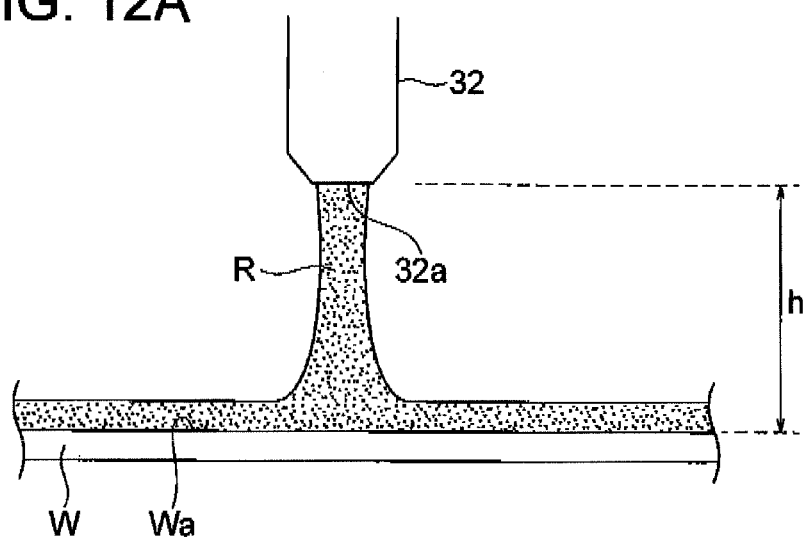
FIGS. 12A and 12B are side views each schematically showing a nozzle and a substrate.
Figure 12B:
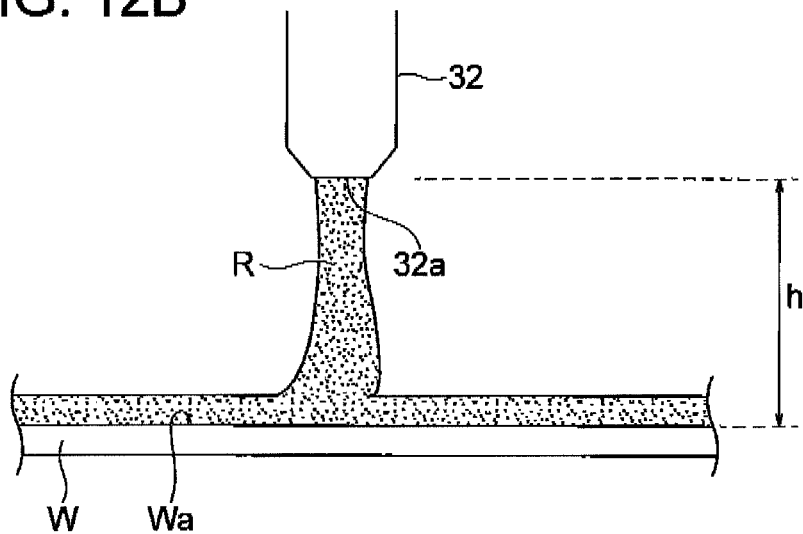

The distance between the orifice 32a of the nozzle 32 and the surface Wa of the wafer W may be made shorter when the wafer W is rotating at the second rotational speed ω2 than when the wafer W is rotating at the first rotational speed ω1. FIGS. 12A and 12B each illustrate a liquid column extending from the orifice 32a to the wafer W; FIG. 12A illustrates the state of the liquid column as observed when the wafer W is rotating at the first rotational speed ω1, and FIG. 12B illustrates the state of the liquid column as observed when the wafer W is rotating at the second rotational speed ω2. As shown in FIGS. 12A and 12B, when the rotational speed of the wafer W is increased from the first rotational speed ω1 to the second rotational speed ω2, the liquid column extending from the orifice 32a to the wafer W can sometimes tilt due to the high-speed rotation of the wafer W, resulting in non-uniform coating of the processing liquid R on the surface Wa of the wafer W. The liquid column is less likely to tilt by making the distance h between the orifice 32a of the nozzle 32 and the surface Wa of the wafer W shorter when the wafer W is rotating at the second rotational speed ω2. This can further enhance the uniformity of the coating state of the processing liquid R on the wafer W.

In order to effectively reduce entrainment of bubbles into the processing liquid R, the inner diameter of the nozzle 32 may be made small at such a level as not to cause a shortage of the amount of the processing liquid R supplied to the wafer W. The smaller the inner diameter of the nozzle 32 is, the smaller is the area of contact between the inner surface of the nozzle 32 and the processing liquid R; therefore, flow turbulence is less likely to occur within the nozzle 32. This reduces entrainment of bubbles into the processing liquid R.

From the same viewpoint as the decrease in the inner diameter of the nozzle 32, smoothing of the inner surface of the nozzle 32 is effective in reducing entrainment of bubbles into the processing liquid R. Another effective method for reducing entrainment of bubbles into the processing liquid R is to keep the lower end of the processing liquid R in the nozzle 32 as close to the end surface of the nozzle 32 as possible before starting the supply of the processing liquid R.

The coating unit U1 according to the instant disclosure comprises: the rotary holder 20 for holding and rotating a wafer W; the nozzle 32 disposed above the wafer W; the nozzle moving section 50 for moving the nozzle 32; the processing liquid supply section 30 for supplying the processing liquid R to the nozzle 32; and the controller 60 for controlling the rotary holder 20 to rotate the wafer W at a first rotational speed ω1, controlling the nozzle moving section 50 to move the nozzle 32 to a position above an eccentric position on the wafer W which lies at a distance from the center CL1 of rotation of the wafer W, controlling the processing liquid supply section 30 to start the supply of the processing liquid R to the surface Wa of the wafer W at the eccentric position at a distance from the center CL1 of rotation of the wafer W, controlling the nozzle moving section 50 so that the position on the wafer W to which the processing liquid R is supplied moves toward the center CL1 of rotation of the wafer W and, after the processing liquid supply position has reached the center CL1 of rotation of the wafer W, controlling the rotary holder 20 to rotate the wafer W at a second rotational speed ω2 which is higher than the first rotational speed ω1, thereby allowing the processing liquid R to spread on the surface Wa of the wafer W.

A recording medium according to the instant disclosure stores a program for causing an apparatus to perform the above-described liquid processing method.

[Reference Embodiment]

A reference embodiment will now be described. The reference embodiment is directed to preventing bubbles from remaining on a wafer W by a method different from the method according to the above-described embodiment. The method of the reference embodiment can be performed by means of the same coating unit U1 as used in the above-described embodiment. The reference embodiment will therefore be described only with respect to a procedure for coating a processing liquid R.

Figure 13:
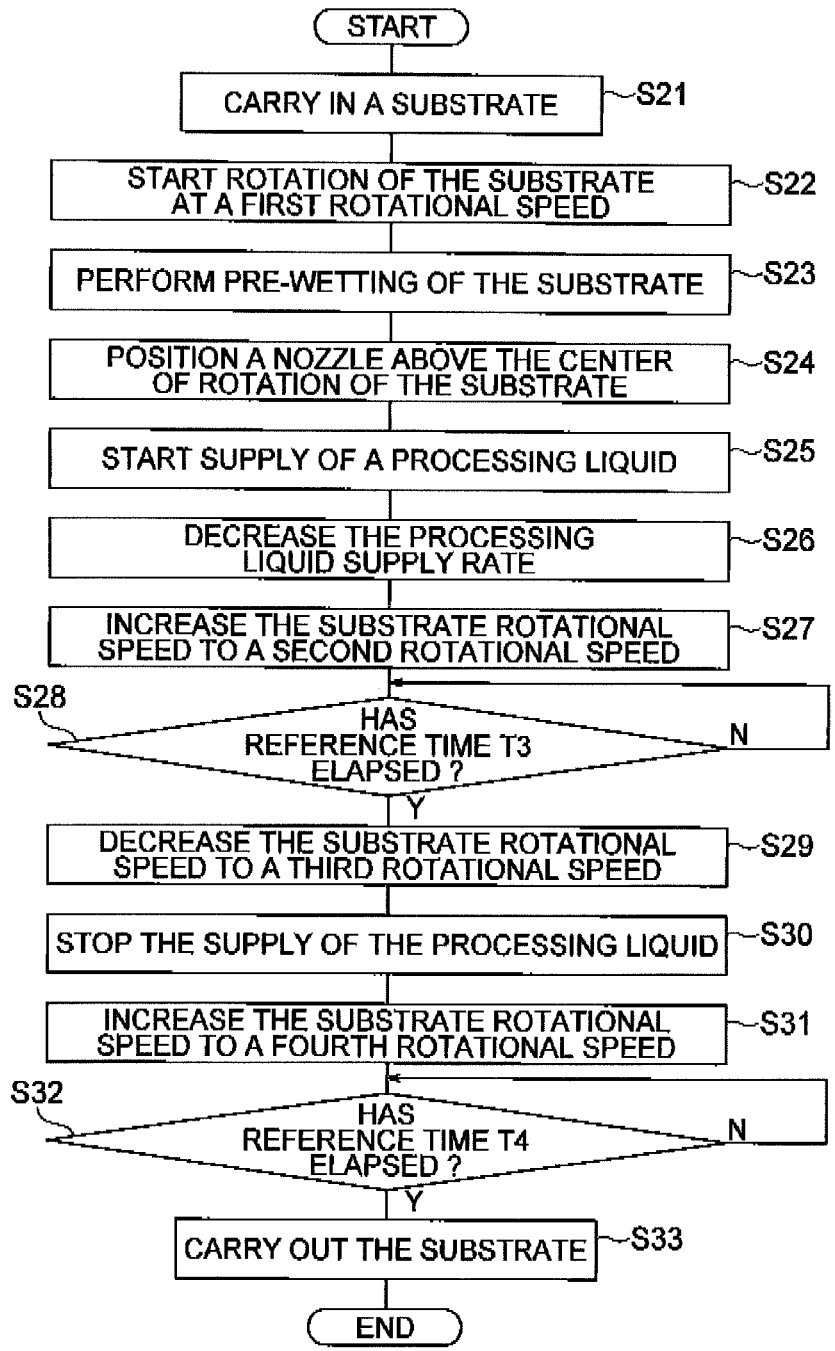
FIG. 13 is a flow chart showing a procedure for performing a liquid processing method according to a reference embodiment.

In the reference embodiment, as shown in FIG. 13, the controller 60 first performs step S21. In step S21, as in the above-described step S01, the transport control section 61 controls the holder portion 22, the lifting portion 26 and the transport arm A3 to carry a wafer W into the coating unit U1.

Next, the controller 60 performs step S22. In step S22, the rotation control section 62 controls the rotating portion 24 to rotate the wafer W at a first rotational speed ω21. The first rotational speed ω21 is, for example, more than 0 rpm and not more than 120 rpm.

Next, the controller 60 performs step S23. In step S23, the second supply position control section 64 controls the drive 56 to move the nozzle 42 to a position above an eccentric position on the wafer W which lies at a distance from the center CL1 of rotation of the wafer W. Thereafter, the second supply amount control section 66 controls the pre-wetting liquid supply source 41 and the valve 43 so that a pre-wetting liquid S is ejected from the nozzle 42. Consequently, the pre-wetting liquid S is coated on the wafer W in an area surrounding the center CL1 of rotation of the wafer W. The amount of the pre-wetting liquid S supplied per unit time is, for example, 25 to 125 ml/sec.

Next, the controller 60 performs step S24. In step S24, the first supply position control section 63 controls the drive 54 to move the nozzle 32 to a position above the center CL1 of rotation of the wafer W.

Next, the controller 60 performs step S25. In step 925, the first supply amount control section 65 controls the processing liquid supply source 31 and the valve 33 so that a processing liquid R is ejected from the nozzle 32. The supply of the processing liquid R to the surface Wa of the wafer W is started at the position on the center CL1 of rotation of the wafer W. In this embodiment the supply rate of the processing liquid R in step S25 is, for example, 1 ml/sec.

Figure 14A:
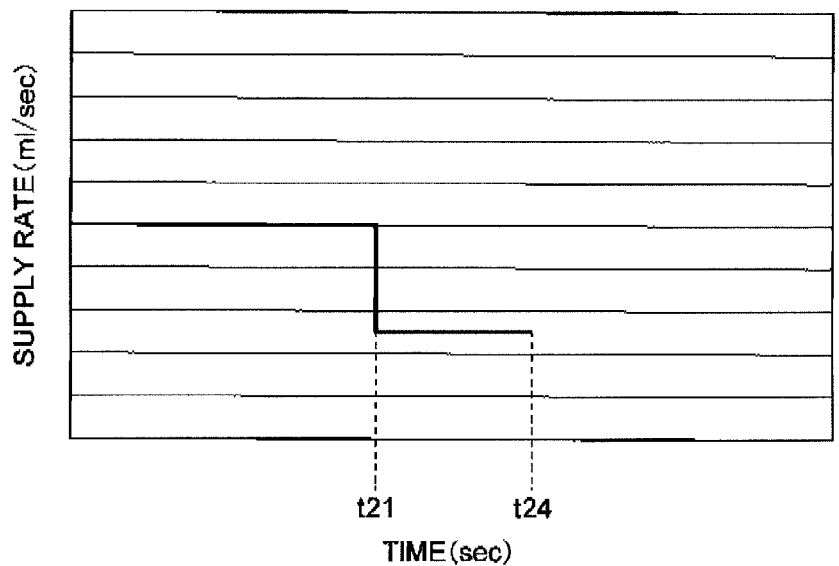
FIGS. 14A and 14B are graphs showing a relationship between the rotational speed of a substrate and the supply rate of a processing liquid.

Next, the controller 60 performs step S26. In step S26, the first supply amount control section 65 controls at least one of the processing liquid supply source 31 and the valve 33 to decrease the supply rate of the processing liquid R. FIG. 14A is a graph showing change in the supply rate over time. In the graph, time t21 indicates the time of execution of step S26. In this embodiment the supply rate of the processing liquid R after the execution of step S26 is, for example, 0.5 ml/sec.

Next, the controller 60 performs step 327. In step S27, the rotation control section 62 controls the rotating portion 24 to change the rotational speed of the wafer W to a second rotational speed ω22. FIG. 142 is a graph showing change in the rotational speed of the wafer W over time. In the graph, time t22 indicates the time of execution of step S27. As shown in the graph, the second rotational speed ω22 is higher than the first rotational speed ω21. The second rotational speed ω22 is, for example, 1500 to 4000 rpm. Time t22 may be set equal to time t21.

Next, the controller 60 performs step S28. In step S28, the controller 60 waits for a preset reference time T3 to elapse. The reference time T3 is, for example, set such that it allows for the processing liquid R to fully spread on the surface Wa of the wafer W. In this embodiment the reference time T3 is, for example, two second. Step S28 corresponds to the above-described step S13.

Figure 14B:
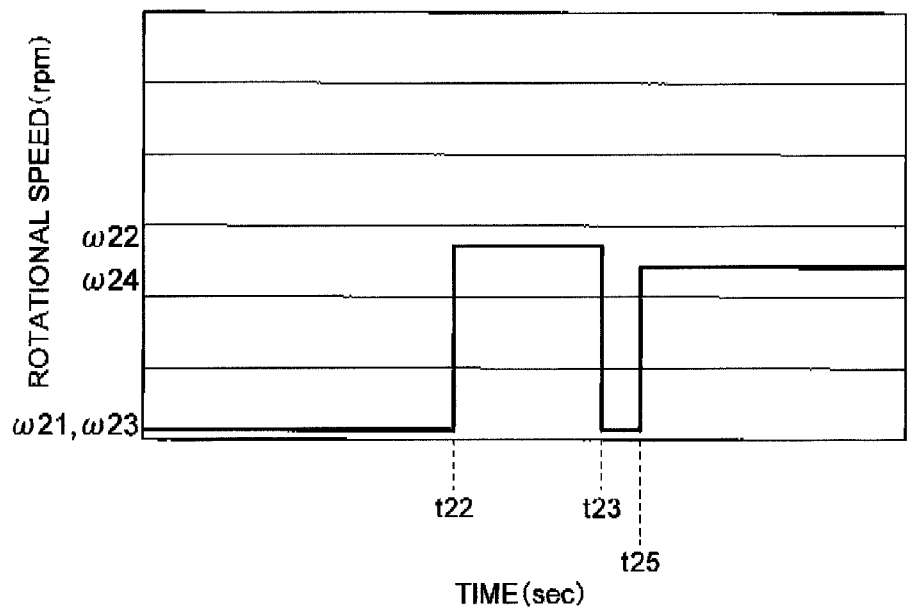

Next, the controller 60 performs step S29. In step S29, the rotation control section 62 controls the rotating portion 24 to change the rotational speed of the wafer W to a third rotational speed ω23. In FIG. 14B, time t23 indicates the time of execution of step S29. As shown in FIG. 14B, the third rotational speed ω23 is lower than the second rotational speed ω22. In one example, the third rotational speed ω23 is set equal to the first rotational speed ω21 in step S22. Step S29 corresponds to the above-described step S14.

In step S30, the first supply amount control section 65 controls the processing liquid supply source 31 and the valve 33 to stop the supply of the processing liquid R. In FIG. 14A, time t24 indicates the time of execution of step S30.

Next, the controller 60 performs step S31. In step S31, the rotation control section 62 controls the rotating portion 24 to rotate the wafer W at a fourth rotational speed ω24. In FIG. 14B, time t25 indicates the time of execution of step S31. As shown in FIG. 14B, the fourth rotational speed ω24 is higher than the third rotational speed ω23 and lower than the second rotational speed ω22. Step S31 corresponds to the above-described step S16.

Next, the controller 60 performs step S32. In step S32, the controller 60 waits for a preset reference time T4 to elapse. The reference time T4 is set such that it allows for the liquid film on the surface Wa of the wafer W to dry. The reference time T4 is, for example, 20 to 60 seconds. A coating film is thus formed on the surface Wa of the wafer W. Step S32 corresponds to the above-described step S17.

Next, the controller 60 performs step S33. In step S33, as in the above-described step S18, the transport control section 61 controls the holder portion 22, the lifting portion 26 and the transport arm A3 to carry the wafer W out of the coating unit U1.

As described hereinabove, the liquid processing method according to the reference embodiment comprises starting the supply of a processing liquid R to the surface Wa of a wafer W at a position on the center CL1 of rotation of the wafer W while rotating the wafer W at a first rotational speed ω21, and rotating the wafer W at a second rotational speed ω22 which is higher than the first rotational speed ω21, thereby allowing the processing liquid R to spread toward the periphery of the wafer W. The supply rate of the processing liquid R is made lower when spreading the processing liquid R on the wafer W rotating at the second rotational speed ω22 than when supplying the processing liquid R to the wafer W rotating at the first rotational speed ω21. The time to spread the processing liquid R on the wafer W rotating at the second rotational speed ω22 can therefore be increased while reducing the consumption of the processing liquid R. This can prevent bubbles from remaining on the wafer W.

While the present invention has been described with reference to preferred embodiments, it is understood that the present invention is not limited to the embodiments described above, but is capable of various changes and modifications within the spirit and scope of the inventive concept as expressed herein.

DESCRIPTION OF THE REFERENCE NUMERALS 20 rotary holder
22 holder portion
24 rotating portion
26 lifting portion
28 cup
30 processing liquid supply section
31 processing liquid supply source
32 nozzle
33 valve
40 pre-wetting liquid supply section
41 pre-wetting liquid supply source 42 nozzle
43 valve
50 nozzle moving section
60 controller
U1 coating unit
W wafer

What is claimed is:

1. A liquid processing method comprising:
starting the supply of a processing liquid to a surface of a substrate at an eccentric position at a distance from the center of rotation of the substrate, and moving the position on the substrate to which the processing liquid is supplied toward the center of rotation of the substrate while rotating the substrate at a first rotational speed; and,
after the processing liquid supply position has reached the center of rotation of the substrate, rotating the substrate at a second rotational speed which is higher than the first rotational speed, thereby allowing the processing liquid to spread toward the periphery of the substrate,
wherein the amount of the processing liquid supplied to the surface of the substrate per unit time is made smaller when the substrate is rotating at the first rotational speed than that when the substrate is rotating at the second rotational speed.

2. The liquid processing method according to claim 1, further comprising initially coating a pre-wetting liquid, which promotes the spread of the processing liquid to the periphery of the substrate, onto an area of the surface of the substrate which lies outside the position at which the supply of the processing liquid is started.

3. The liquid processing method according to claim 1, wherein the supply of the processing liquid to the surface of the substrate is started at a position whose distance to the center of rotation of the substrate is more than 0% and not more than 40% of the radius of the substrate.

4. The liquid processing method according to claim 1, wherein the substrate is rotated at least one revolution after starting the supply of the processing liquid and before moving the processing liquid supply position toward the center of rotation of the substrate.

5. The liquid processing method according to claim 1, wherein the moving speed of the processing liquid supply position is increased as it approaches the center of rotation of the substrate.

6. The liquid processing method according to claim 1, wherein the rotational speed of the substrate is increased as the processing liquid supply position approaches the center of rotation of the substrate.

7. The liquid processing method according to claim 1, wherein the distance between an outlet opening for ejecting the processing liquid toward the substrate and the surface of the substrate is made shorter when the substrate is rotating at the second rotational speed than that when the substrate is rotating at the first rotational speed.

8. A non-transitory recording medium storing a program for causing an apparatus to perform the liquid processing method according to claim 1.

9. A liquid processing apparatus comprising:
a rotary holder configured to hold and to rotate a substrate;
a nozzle disposed above the substrate;
a nozzle moving section configured to move the nozzle;
a processing liquid supply section configured to supply a processing liquid to the nozzle; and
a controller configured to control the rotary holder to rotate the substrate at a first rotational speed, to control the nozzle moving section to move the nozzle to a position above an eccentric position on the substrate which lies at a distance from the center of rotation of the substrate, to control the processing liquid supply section to start the supply of the processing liquid to the surface of the substrate at the eccentric position at a distance from the center of rotation of the substrate, to control the nozzle moving section so that the position on the substrate to which the processing liquid is supplied moves toward the center of rotation of the substrate and, after the processing liquid supply position has reached the center of rotation of the substrate, to control the rotary holder to rotate the substrate at a second rotational speed which is higher than the first rotational speed, thereby allowing the processing liquid to spread on the surface of the substrate, so as to control the processing liquid supply section such that the amount of the processing liquid supplied to the surface of the substrate per unit time is made smaller when the substrate is rotating at the first rotational speed than that when the substrate is rotating at the second rotational speed.

10. A liquid processing method comprising:
starting the supply of a processing liquid to a surface of a substrate at an eccentric position at a distance from the center of rotation of the substrate, and moving the position on the substrate to which the processing liquid is supplied toward the center of the rotation of the substrate while rotating the substrate at a first rotational speed; and,
after the processing liquid supply position has reached the center of rotation of the substrate, rotating the substrate at a second rotational speed which is higher than the first rotational speed, thereby allowing the processing liquid to spread toward the periphery of the substrate,
wherein the amount of the processing liquid supplied to the surface of the substrate per unit time is made smaller when starting the supply of the processing liquid than that when the processing liquid supply position is moving toward the center of rotation of the substrate.

11. The liquid processing method according to claim 10, further comprising initially coating a pre-wetting liquid, which promotes the spread of the processing liquid to the periphery of the substrate, onto an area of the surface which lies outside the position at which the supply of the processing liquid is started.

12. The liquid processing method according to claim 10, wherein the supply of the processing liquid to the surface of the substrate is started at a position whose distance to the center of rotation of the substrate is more than 0% and not more than 40% of the radius of the substrate.

13. The liquid processing method according to claim 10, wherein the substrate is rotated at least one revolution after starting the supply of the processing liquid and before moving the processing liquid supply position toward the center of rotation of the substrate.

14. The liquid processing method according to claim 10, wherein the moving speed of the processing liquid supply position is increased as it approaches the center of rotation of the substrate.

15. The liquid processing method according to claim 10, wherein the rotational speed of the substrate is increased as the processing liquid supply position approaches the center of rotation of the substrate.

16. The liquid processing method according to claim 10, wherein the distance between an outlet opening for ejecting the processing liquid toward the substrate and the surface of the substrate is made shorter when the substrate is rotating at the second rotational speed than that when the substrate is rotating at the first rotational speed.

17. A non-transitory recording medium storing a program for causing an apparatus to perform the liquid processing method according to claim 10.

18. A liquid processing apparatus comprising:
a rotary holder configured to hold and to rotate a substrate;
a nozzle disposed above the substrate;
a nozzle moving section configured to move the nozzle;
a processing liquid supply section configured to supply a processing liquid to the nozzle; and
a controller configured to control the rotary holder to rotate the substrate at a first rotational speed, to control the nozzle moving section to move the nozzle to a position above an eccentric position on the substrate which lies at a distance from the center of rotation of the substrate, to control the processing liquid supply section to start the supply of the processing liquid to the surface of the substrate at the eccentric position at a distance from the center of rotation of the substrate, to control the nozzle moving section so that the position on the substrate to which the processing liquid is supplied moves toward the center of rotation of the substrate and, after the processing liquid supply position has reached the center of rotation of the substrate, to control the rotary holder to rotate the substrate at a second rotational speed which is higher than the first rotational speed, thereby allowing the processing liquid to spread on the surface of the substrate, so as to control the processing liquid supply section such that the amount of the processing liquid supplied to the surface of the substrate per unit time is made smaller when starting the supply of the processing liquid than that when the processing liquid supply position is moving toward the center of rotation of the substrate.

* * * * *